United States Patent [19]

Araihara

[11] Patent Number: 4,610,940
[45] Date of Patent: Sep. 9, 1986

[54] METHOD FOR FABRICATING A PHOTOMASK PATTERN

[75] Inventor: Satoshi Araihara, Yokohama, Japan
[73] Assignee: Fujitsu Limited, Kawasaki, Japan
[21] Appl. No.: 658,626
[22] Filed: Oct. 9, 1984
[30] Foreign Application Priority Data Oct. 17, 1983 [JP] Japan ................. 58-194580

[51] Int. Cl.$^4$ ................. G03F 9/00
[52] U.S. Cl. ................. 430/5; 430/22; 430/394; 355/53; 356/401
[58] Field of Search ........... 430/5, 22, 394; 355/53, 355/86; 356/401

[56] References Cited

U.S. PATENT DOCUMENTS 4,362,385 12/1982 Lobach ................. 355/77
4,388,386 6/1983 King et al. ................. 430/5

FOREIGN PATENT DOCUMENTS 55-134934 10/1980 Japan ................. 430/22
58-4927 1/1983 Japan ................. 430/22

Primary Examiner—John E. Kittle
Assistant Examiner—José G. Dees
Attorney, Agent, or Firm—Staas & Halsey

[57] ABSTRACT

A method for fabricating unit patterns each having the same shape and size for a semiconductor die on a photomask pattern area of a photomask. By designating a matrix having rows and columns for the unit patterns on the photomask pattern area, the fabrication is made in the order of two exposing modes. In the first exposing mode, the fabrication is made by exposing respectively an optical image for the unit pattern on selected several matrix elements placed as far as possible away from each other in the photomask pattern area; in the second exposing mode, the exposure of the unit pattern is made along the row of the matrix elements except for the elements which have been exposed in the first exposing mode, until the exposure for all unit patterns are made by shifting sequentially the exposure to the next row. These exposures of the unit patterns, thusly are made with vernier pattern producing overlapped vernier patterns when the exposures of the first and the second exposing modes are made. Thus, after all the unit patterns have been printed on the photomask base plate, an inspection of the positions of the unit patterns can be made by observing some of the overlapping vernier patterns and measuring the accumulated shears which are produced in the second exposing mode.

12 Claims, 9 Drawing Figures

METHOD FOR FABRICATING A PHOTOMASK PATTERN

BACKGROUND OF THE INVENTION

The present invention relates to a method for fabricating a photomask pattern by which a semiconductor device such as an integrated circuit (IC) or a large scale integrated circuit (LSI) is fabricated.

Before disclosing the present invention, a feature and a fabricating process of the photomask will be explained as background of the invention, and problems of a prior art method for the photomask pattern fabrication will be discussed.

The photomask is made of a base plate of silica glass on which a metal layer and a photoresist layer are sputtered and coated as shown in FIG. 1. The figure illustrates a cut view of the photomask 200; a metal layer 2 of chromium is sputtered on a glass plate 1 and photoresist layer 3 is coated on the metal layer 2. The photoresist pattern is fabricated by processes of exposing an optical image on the photomask, developing and etching it. FIG. 2 illustrates a plan view of the photomask 200 on which a photomask pattern 210 is printed. The photomask pattern 210 consists of plurality of unit patterns 201 separated by scribe lines 220. Each unit pattern 201 has the same shape and size, and corresponds to a pattern for a semiconductor die; this photomask pattern 210 is for a mass production of the semiconductor devices.

FIG. 3 illustrates a printing process for the photomask pattern. In the figure, each unit pattern 201 is printed by exposing an optical image of a reticle pattern 101 on a reticle 100 by means of an optical system 400. The reticle pattern 101 is a mother pattern for the semiconductor die and the size thereof is as large as 10 times that of the exposed unit pattern 201 to perform high accurate printing; accordingly the optical system 400 has a lens 401 having a reduction factor of one-tenth. Each unit pattern 201 is printed in succession by shifting the photomask 200 toward X and Y directions with respect to the fixed optical system 400, which is called a "step-and-repeat printing". An apparatus for the step-and-repeat printing will be explained in more detail with respect to FIG. 4.

FIG. 4 shows a block diagram of an example of the step-and-repeat printing apparatus. In the figure, the photomask 200 is mounted on a stage 500 which is shifted toward X and Y directions as controlled by a stage controller 800. The sequence of the step-and-repeat printing is previously determined and is stored in a memory 600. The data in the memory 600 are read out and amplified by a amplifier 700 and go to the stage controller 800. The data fed to the stage controller 800 controls the stage movement and also controls a light controller 900 to control the light source 402 in the optical system 400 as shown in FIG. 3, synchronization with the step-andrepeat movement of the stage 500.

FIG. 5 is a schematic diagram illustrating the prior art sequence of the step-and-repeat printing, showing an arrangement of unit patterns in a matrix having rows and columns on a photomask pattern area of the photomask. The step-and-repeat printing is performed so that the exposure of the unit pattern is advanced from a leftmost matrix element 11 to a matrix element 12, 13,—sequentially in a direction to the right along the first row as shown by the arrow A, and when the exposure of the first row is finished, the exposed is shifted down to the rightmost matrix element 16 in the second row and advanced toward the left as shown by an arrow B; thus, the exposure is advanced in the matrix in zigzag pattern as shown by arrows A, B, C,—, to repeat a step-and-repeat exposure with an equal pitch "P" in the row and column directions.

As the semiconductor circuit is complicated, a plurality of photomasks is required to fabricate the semiconductor device from a wafer, and the position of the unit patterns on each photomask must coincide with each other when they are overlapped to make up the pattern of the IC device. Therefore, the unit patterns on the photomask, and especially their positions, must be carefully inspected after printing. The inspection is performed by observing vernier patterns printed together with each of the unit patterns on the photomask through a microscope. FIG. 6 shows an example of a vernier pattern called a cross-shaped vernier pattern which has four branches top, bottom, left and right. The respective numbers of teeth of the top and bottom branches, and those of the left and right branches, are different by one tooth, which combination provides a vernier. In the reticle pattern, mother patterns of the vernier patterns are provided at the respective four corners, so that the numbers of the teeth at each of the top and bottom and left and right branches become different in the overlapping cross-shaped vernier patterns. The vernier patterns of adjacent unit patterns are overlapped with each other when they are printed on the photomask. FIG. 7 shows this situation; for example, a pattern 230 is formed by overlapping the vernier patterns of the unit patterns 202, 203, 204, and 205. Accordingly, the shear of unit patterns which are printed adjacent each other can be measured by observing the pattern 230, and the kind of this pattern 230 will be called a "overlapped vernier pattern" hereinafter. As the number of the unit patterns on the photomask is as many as several thousands in some cases, it is actually impossible to measure all the overlapped vernier patterns. However, it is well known from the art of inspection that several points are enough for the inspection, for example, four points each placed near the middle part of four respective sides of the photomask pattern, for instance, as shown by points a, b, c, and d in FIG. 5, are enough to inspect the positions of unit patterns on the photomask pattern.

In the prior art method however, there have been problems as follows.

(1) The printed shear in the exposing process is accumulated as the step is advanced along the row of unit patterns as shown by the arrows A, B, or C in FIG. 5.

(2) The shear accumulation occurs by electrical and mechanical causes which depend on a feature of the printing apparatus, and it unpredictably happens in some interval as shown by the coordinates in FIG. 8. In the coordinates, the abscissa t is a time of a photomask pattern exposure, the ordinate s is a maximum amount of the shear measured in absolute value obtained by measuring the shear in the photomask pattern, a dotted line R indicates an allowable maximum value of the shear from the ideal position of the unit pattern, and the curve M shows an actual amount of the shear which occurred. In the figure, $t_1$, $t_2$,—, $t_9$ show the time, and if it is assumed that the exposure of the patterns has been done in the respective time intervals from $t_1$ to $t_2$, $t_2$ to $t_3$,—, or $t_8$ to $t_9$, the exposure which has been performed in the interval from $t_1$ to $t_2$, $t_2$ to $t_3$, $t_6$ to $t_7$, $t_7$ to $t_8$, or $t_8$ to t9 ("o" is respectively indicated) results in a good printing, but the exposure which has been performed in the time interval from t3 to t4, t4 to t5, or t5 to t6 ("x" is respectively indicated) results in a bad printing. The time interval for the exposure is a length of several tens of minutes, and the time interval in which the shear begins to exceed the allowable amount R occurs frequently in a period of several hours.

(3) It is impossible to detect the printing shear which exceeds the allowable value of R by observing and measuring the vernier patterns, because each unit pattern respectively has almost the equal amount of the accumulated shear, so that the zero deviation of the vernier does not show the absolute zero deviation.

(4) The absolute amount of the shear can be measured by a laser measuring system. However, a large amount of time is required for the measurement, such as for optical setting. Therefore, the laser measurement is usually used in a laboratory, and the vernier measurement is still used for actual fabrication of the photomask pattern.

SUMMARY OF THE INVENTION

An object of the present invention therefore is to improve the prior art method for fabricating the photomask pattern having a plurality on unit patterns of a semiconductor dice, so that accumulated printing shear, which occurs in step-and-repeat exposure in the printing process and which has been impossible to be detected by the prior art, can be measured by means of vernier patterns. The foregoing objects can be achieved by applying the following two exposing modes for the printing process of the unit patterns. First, an optical image of the unit pattern combined with associated vernier patterns is exposed on some selected matrix elements placed as far as possible away from each other in the photomask pattern area. Second, after the above exposure, the optical image is exposed in a step-and-repeat exposure along the row; that is, the exposure is advanced one by one continuously along the row of a matrix, and by drawing a zigzag pattern to change to the next row at each end of the photomask pattern area. According to the above two steps, the difference between the shear of the first exposed unit pattern and that of the second exposed neighboring unit pattern appears largely because of the shear accumulation of the second exposure. The application of the present invention to the photomask pattern fabrication allows the accumulated printing shear to be detected. As a semiconductor device becomes complicated, a plurality of photomasks are required to fabricate a semiconductor device on a wafer. By applying the present invention to each photomask fabrication, the inspection of each photomask becomes certain, which contributes greatly to reducing the time of the semiconductor fabrication and the cost of a semiconductor device. The present invention also increases the reliability of the semiconductor device. Details and advantages of the present invention will become clear from a reading of the following detailed description of the invention in connection with the accompanying drawings.

DESCRIPTION OF THE PREFERRED EMBODIMENTS

Figure 9:
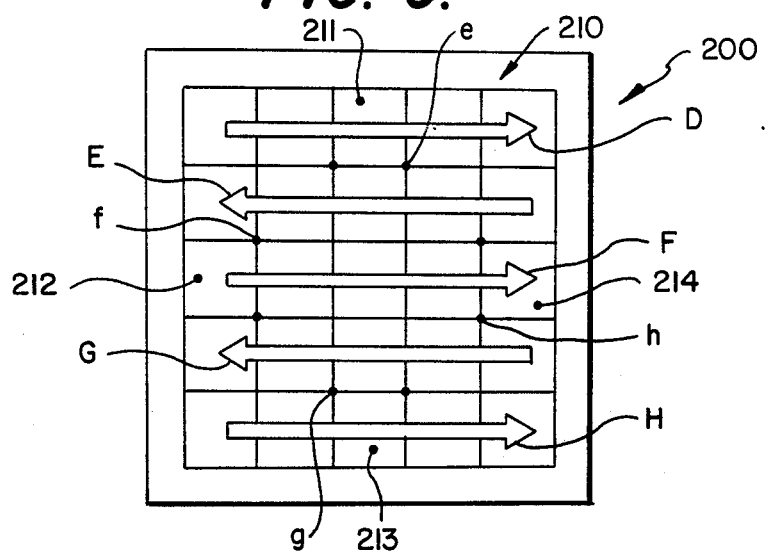
FIG. 9 is an illustrating diagram for an embodiment of the present invention showing a sequencne of printing the unit patterns in a matrix in the photomask pattern area.

FIG. 9 shows an embodiment of a photomask pattern to which a method of the present invention is applied. The figure illustrates a matrix for arranging a plurality of the unit patterns on a photomask pattern area of the photomask 200. The parts divided in a checked pattern are the matrix elements for respective unit patterns, and the optical image for each unit pattern is successively exposed on the matrix element with four vernier patterns a respective placed at each corner of the unit pattern. The exposure is made by the following two exposing modes:

first, the exposure is respectively made on the selected matrix elements 211, 212, 213, and 214, each of which is located at a middle part of a respective one of four side edges of the area of the photomask pattern 210 (the photomask pattern area), this exposure being called a "first exposing mode" hereinafter; and second, the exposures for other matrix elements are made by the usual step-and-repeat exposure along the rows of the matrix, drawing a zigzag pattern in changing rows as shown by arrows, D, E, F, G, and H in the figure, this exposure being called a "second exposing mode" hereinafter.

Figure 1:
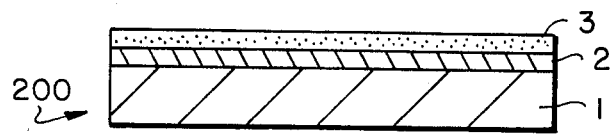
FIG. 1 is a section view illustrating a photomask.
Figure 2:
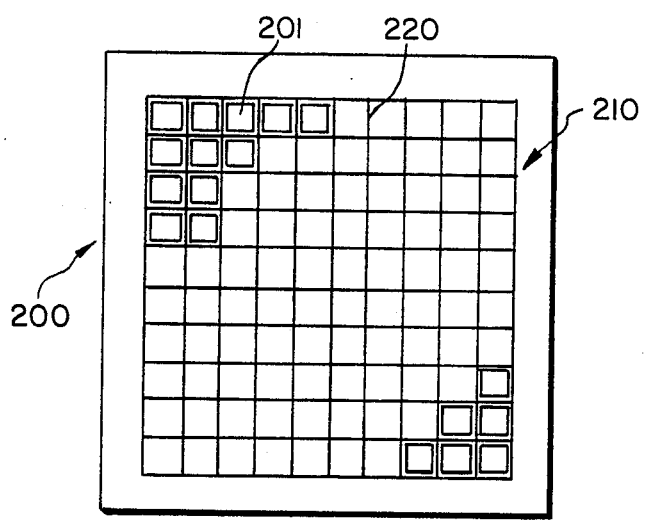
FIG. 2 is a plan view illustrating a photomask.
Figure 3:
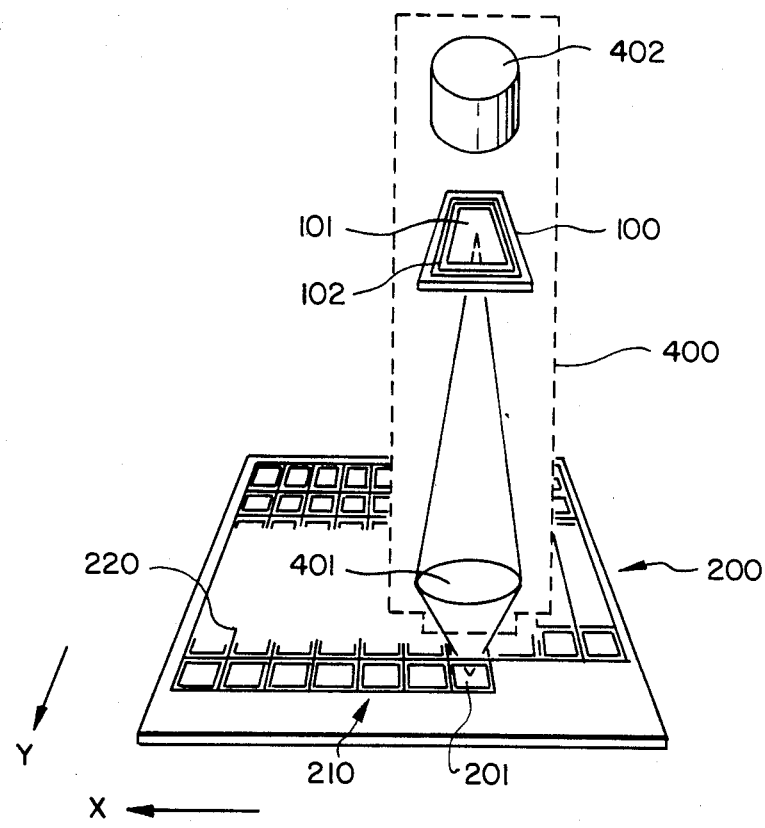
FIG. 3 is a perspective diagram illustrating fabrication of a photomask.
Figure 4:
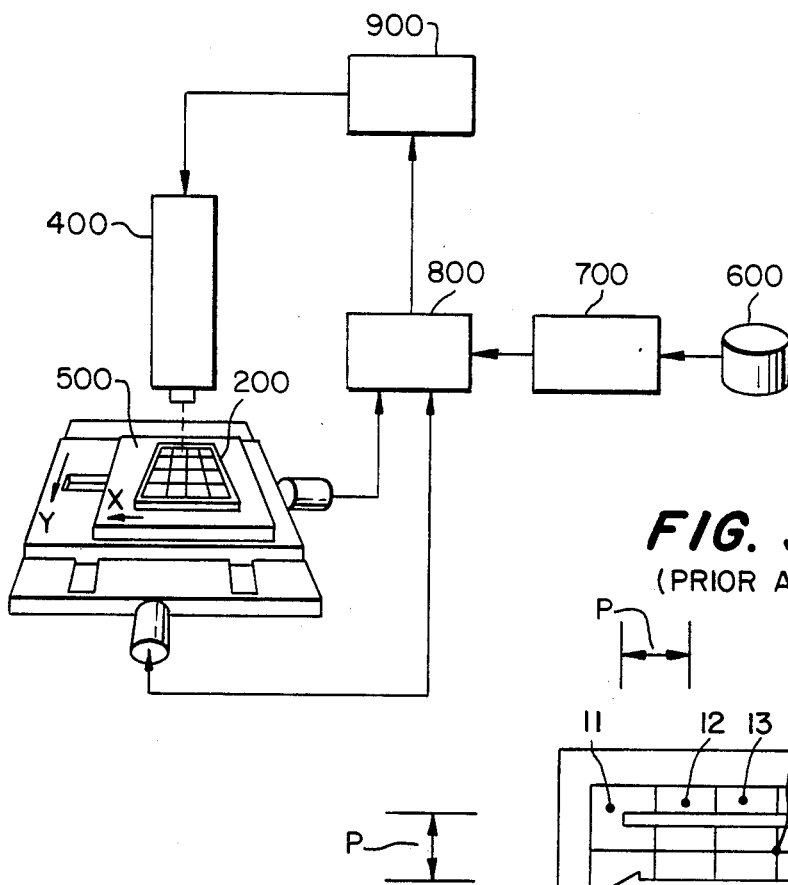
FIG. 4 is a block diagram of an apparatus for controlling the device for the photomask pattern fabrication.
Figure 5:
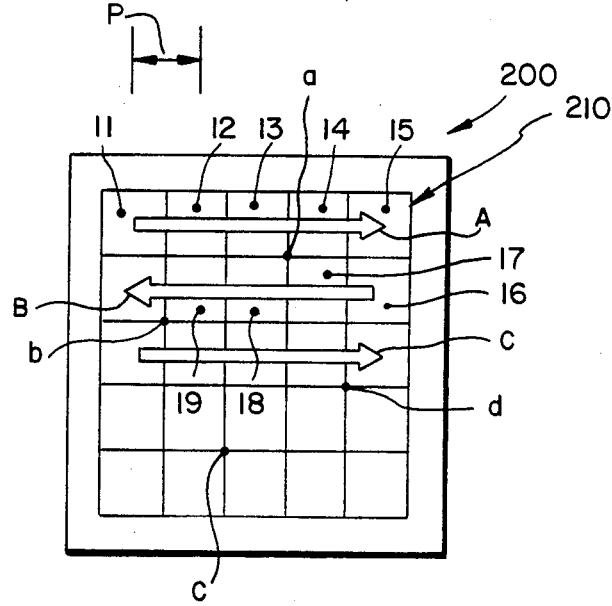
FIG. 5 is an illustrating diagram showing a prior art sequence of printing unit patterns in a matrix in the photomask pattern area.
Figure 6:
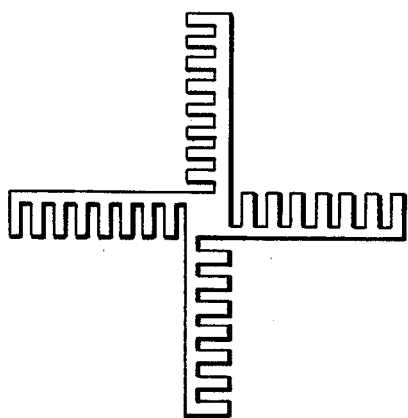
FIG. 6 is an illustrating diagram of a prior art cross-shaped vernier pattern.
Figure 7:
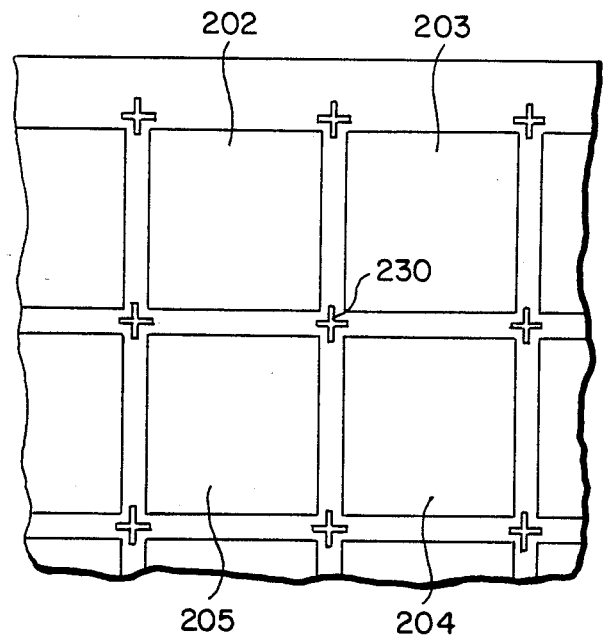
FIG. 7 is an enlarged diagram showing a part of the plan view of unit patterns printed on a photomask pattern area with overlapped vernier patterns.
Figure 8:
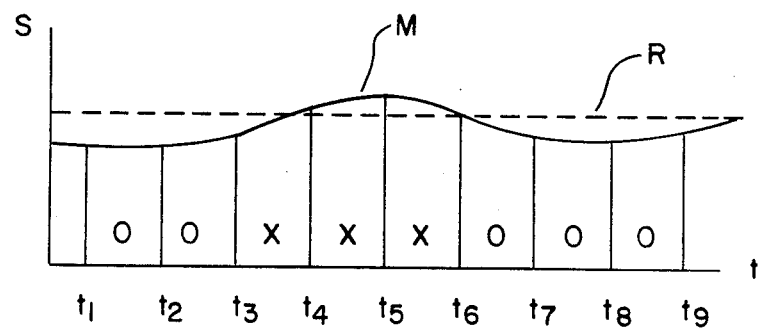
FIG. 8 is a graph showing a time variation of an accumulated shear occurring in an apparatus for photomask printing.

These first and second exposing modes are performed by the printing apparatus of FIG. 4 using the program for the exposing modes previously stored in the memory 600.

After printing, the positions of the unit patterns in the photomask pattern 210 are inspected by observing the overlapped vernier patterns at selected points as shown by points e, f, g, and h in FIG. 9. As each overlapped vernier pattern is formed by the two exposing modes, the accumulated shear can be detected with certainty, because the overlapped vernier patterns in the first exposing mode are printed at different times from that in the second exposing mode. That is, in the first exposing mode, there is no accumulated shear in the selected unit patterns 211, 212, 213, and 214. On the other hand, in the second exposing mode, the accumulated shear is caused because of the step-and-repeat procedure.

In the first exposing mode, the exposure is not always necessary to be made at the middle parts of the side edges of the photomask pattern area, namely it can be done on the parts placed as far as possible away from the others in the photomask pattern area. To make the detection of the accumulated shear in the photomask pattern possible, it is only required that the overlapped vernier patterns should be provided by the vernier patterns exposed by the two exposing modes.

If a random exposure were applied instead of the step-and-repeat exposure along the row, the accumulated shear could be detected by the random exposure and there would be no necessity to provide the above two exposing modes. However, it cannot be actually applied, because the random exposure requires a program to be prepared, which is a complicated task and involves a lot of time and, further, great attention must be paid to avoid the occurrence of soft errors in each photomask. This causes the cost to rise and lowers the reliability of the photomask fabrication. Consequently, the second exposing mode is required and the step-and-repeat exposure along the row is most practical for the photomask fabrication.

What is claimed is:

1. A method for fabricating a photomask pattern in a layer to be patterned on a photomask plate, said photomask pattern having a plurality of unit patterns arranged in a matrix on an area of said photomask plate, each said unit pattern including vernier patterns arranged in said unit pattern so that overlap of said vernier patterns of adjoining ones of said unit patterns in said matrix occurs, comprising the steps of:

forming said layer to be patterned on the photomask plate;

forming a layer of resist on said layer to be patterned;

exposing said layer of resist individually to an optical image of said unit pattern at a plurality of first positions of said matrix, in a respective succession of times, said plurality of positions being spaced relatively apart from each other within said matrix, as a first exposing mode;

exposing said layer of resist to said optical image in a step-and-repeat movement at the remaining positions of said matrix, including changing the rows one by one after finishing said exposure in said step-and-repeat along each said row, until said unit pattern is exposed at all the positions of said matrix, as a second exposing mode;

developing said layer of resist;

forming said photomask pattern in said layer to be patterned by using said developed layer of resist;

inspecting the positions of said unit patterns of said second exposing mode of the formed photomask pattern over said area by observing the respective amounts of said overlap of the respective vernier patterns exposed by said first exposing mode with respective ones of those exposed by said second exposing mode, so as to enable measurement of accumulated printed shear produced in said second exposing mode over said area of said photomask pattern.

2. A method according to claim 1, wherein each said vernier pattern comprises four cross-shaped vernier patterns each placed at a respective one of four corners of each said unit pattern.

3. A method according to claim 1, wherein said first exposing mode is performed by exposing said optical image at four respective positions of said matrix each placed at a middle part of a respective one of four side edges of said matrix.

4. A method according to claim 2, wherein said first exposing mode is performed by exposing said optical image at four respective positions of said matrix each placed at a middle part of respective one of four side edges of said matrix.

5. A method according to claim 1, wherein said second exposing mode is performed by changing said exposing along each said row to the adjacent row in a zigzag pattern, until all the matrix elements are exposed.

6. A method according to claim 2, wherein said second exposing mode is performed by changing said exposing along each said row to the adjacent row in a zigzag pattern, until all the matrix elements are exposed.

7. A method according to claim 3, wherein said second exposing mode is performed by changing said exposing along each said row to the adjacent row in a zigzag pattern, until all the matrix elements are exposed.

8. A method according to claim 4, wherein said second exposing mode is performed by changing said exposing along each said row to the adjacent row in a zigzag pattern, until all the matrix elements are exposed.

9. A method according to claim 3, wherein said inspection of said unit pattern positions is performed by observing respective overlapping ones of said vernier patterns at said four matrix elements placed at the middle parts of the respective four side edges of said photomask pattern area.

10. A method according to claim 7, wherein said inspection of said unit pattern positions is performed by observing respective overlapping ones of said vernier patterns at said four matrix elements placed at the middle parts of the respective four side edges of said photomask pattern area.

11. A method according to claim 2, said vernier pattern of each said unit pattern of said first exposing mode having a respective part that overlaps with a respective part of the vernier pattern of an adjoining unit pattern of said second exposing mode.

12. A method according to claim 3, said vernier pattern of each said unit pattern of said first exposing mode having a respective part that overlaps with a respective part of the vernier pattern of an adjoining unit pattern of said second exposing mode.

* * * * *

UNITED STATES PATENT AND TRADEMARK OFFICE
CERTIFICATE OF CORRECTION

PATENT NO. : 4,610,940

DATED : 9 September 1986

INVENTOR(S) : SATOSHI ARAIHARA

It is certified that error appears in the above-identified patent and that said Letters Patent is hereby corrected as shown below:

Col. 1, line 58, "step-andrepeat" should be --step-and-repeat--;
line 68, "exposed" should be --exposure--.

Col. 2, line 36, "a" should be --an--.

Col. 3, line 27, "plurality on" should be --plurality of--;
line 27, "patterns of" should be --patterns on--.

Col. 4, line 29, "a respective" should be --each--;
line 29, "at each" should be --at a respective--.

Signed and Sealed this

Twenty-third Day of December, 1986

Attest:

DONALD J. QUIGG

Attesting Officer    Commissioner of Patents and Trademarks